(12) United States Patent
Park et al.

(10) Patent No.: US 10,600,858 B2
(45) Date of Patent: Mar. 24, 2020

(54) ORGANIC LIGHT-EMITTING DISPLAY DEVICE AND METHOD OF MANUFACTURING THE SAME

(71) Applicant: SAMSUNG DISPLAY CO., LTD., Yongin-si, Gyeonggi-Do (KR)

(72) Inventors: Soyeon Park, Yongin-si (KR); Zail Lhee, Yongin-si (KR); Jeongho Lee, Yongin-si (KR); Yanghee Kim, Yongin-si (KR); Wonho Kim, Yongin-si (KR); Hyungchul Lim, Yongin-si (KR); Mina Jung, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/182,850

(22) Filed: Nov. 7, 2018

(65) Prior Publication Data

US 2019/0312095 A1    Oct. 10, 2019

(30) Foreign Application Priority Data

Apr. 10, 2018   (KR) .................. 10-2018-0041719

(51) Int. Cl.
*H01L 27/32* (2006.01)
*H01L 51/52* (2006.01)
*H05K 1/11* (2006.01)

(52) U.S. Cl.
CPC ...... *H01L 27/3276* (2013.01); *H01L 51/5253* (2013.01); *H05K 1/113* (2013.01);
(Continued)

(58) Field of Classification Search
CPC ............. H01L 27/3276; H01L 51/5253; H01L 2227/323; H05K 1/118; H05K 1/113; H05K 2201/10128
See application file for complete search history.

(56) References Cited

U.S. PATENT DOCUMENTS 6,399,496 B1    6/2002   Edelstein et al.
7,639,338 B2   12/2009   Tomari et al.
(Continued)

FOREIGN PATENT DOCUMENTS

JP            4554983      7/2010
KR       1020060017279     2/2006
(Continued)

*Primary Examiner* — Syed I Gheyas
(74) *Attorney, Agent, or Firm* — F. Chau & Associates, LLC

(57) ABSTRACT

Provided are an organic light-emitting display device and a method of manufacturing the same. The organic light-emitting display device includes a panel including a display unit on which an image is formed and a pad unit including a plurality of terminals connected to the display unit and arranged in a plurality of rows on a substrate, and a flexible circuit board including metal wirings arranged in a plurality of layers so as to be respectively connected in correspondence to the plurality of rows of terminals in the pad unit and being coupled to the pad unit, in which the pad unit includes a one-row terminal zone in which only terminals in a single row from among the plurality of rows of terminals electrically connect the metal wirings to the display unit.

26 Claims, 8 Drawing Sheets

(52) U.S. Cl.
CPC ........ *H05K 1/118* (2013.01); *H01L 2227/323* (2013.01); *H05K 2201/10128* (2013.01)

(56) References Cited

U.S. PATENT DOCUMENTS

| | | |
|---|---|---|
| 7,675,177 B1 | 3/2010 | Lu et al. |
| 2002/0098681 A1 | 7/2002 | Hu et al. |
| 2006/0007086 A1 | 1/2006 | Rhee et al. |
| 2007/0109462 A1* | 5/2007 | Lee ...................... G02B 6/0086 349/58 |
| 2009/0174825 A1* | 7/2009 | Yee ....................... G06F 1/1601 348/801 |
| 2011/0193478 A1* | 8/2011 | Kim ....................... H05K 1/189 315/32 |
| 2014/0140019 A1 | 5/2014 | Park et al. |
| 2016/0218289 A1 | 7/2016 | Lee et al. |
| 2016/0307990 A1* | 10/2016 | Kwon ................. H01L 27/3279 |
| 2017/0062478 A1 | 3/2017 | Choi |
| 2017/0092195 A1* | 3/2017 | Jung .................... G09G 3/3258 |
| 2017/0200709 A1 | 7/2017 | Kim et al. |
| 2017/0309646 A1* | 10/2017 | Son ..................... G06F 3/03547 |

FOREIGN PATENT DOCUMENTS

| | | |
|---|---|---|
| KR | 1020140063305 | 5/2014 |
| KR | 1020160082555 | 7/2016 |
| KR | 1020170026781 | 3/2017 |
| KR | 1020170084406 | 7/2017 |
| KR | 1020170120478 | 10/2017 |

* cited by examiner

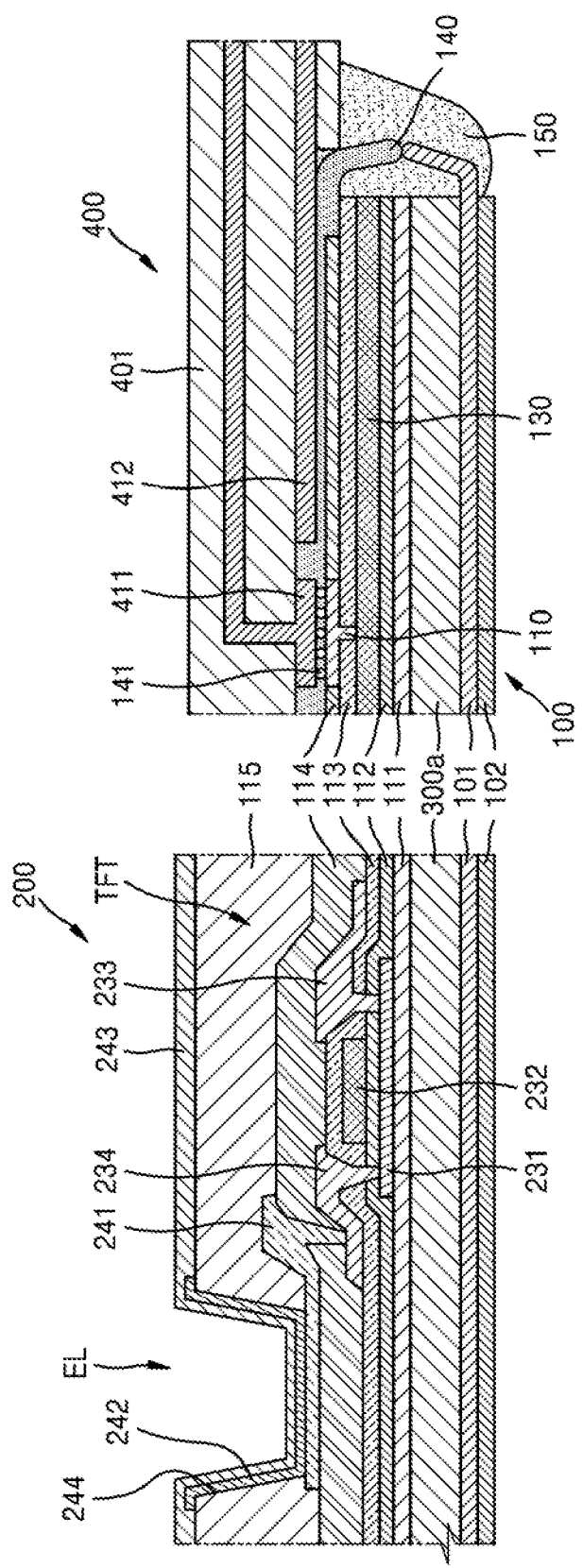

ORGANIC LIGHT-EMITTING DISPLAY DEVICE AND METHOD OF MANUFACTURING THE SAME

CROSS-REFERENCE TO RELATED APPLICATION

This application claims the benefit under 35 U.S.C. § 119 of Korean Patent Application No. 10-2018-0041719, filed on Apr. 10, 2018, in the Korean Intellectual Property Office, the disclosure of which is incorporated by reference herein in its entirety.

TECHNICAL FIELD

Exemplary embodiments of the present disclosure relate to an organic light-emitting display device and a method of manufacturing the same, and more particularly, to an organic light-emitting display device having an enhanced structure of a pad unit for electrically connecting a panel to an external device and a method of manufacturing the same.

DISCUSSION OF RELATED ART

Generally, an organic light-emitting display device includes a thin-film transistor and an organic light-emitting device in a display unit of a panel. The organic light-emitting display device receives an appropriate driving signal from the thin-film transistor to emit light and display a desired image.

The thin-film transistor and the organic light-emitting device are connected to a pad unit provided in a non-display unit on one end of the panel by wiring. An external device such as a driving chip is electrically connected to the thin-film transistor and the organic light-emitting device in the display unit by coupling a flexible circuit board such as a chip on film (COF) to the pad unit. That is, metal wirings in the flexible circuit board are connected to connection terminals in the pad unit.

In recent years, as the number of connection terminals to be arranged in a limited space of the pad unit increases, a 2 rows-2 layers connection structure, in which terminals are arranged in two rows of first and second rows in the pad unit, and a first metal wiring connected to the first row terminals and a second metal wiring connected to the second row terminals are arranged in two layers in the flexible circuit board, is under consideration.

Incidentally, corrosion frequently occurs rapidly in the second metal wiring relatively close to an end of a panel among the first and second metal wirings of the flexible circuit board. Particularly, such rapid corrosion is frequently observed around high voltage terminals.

When the corrosion progresses rapidly, electric signals may not be transmitted and received properly, which causes problems in driving and eventually leads to product failure.

SUMMARY

Exemplary embodiments of the present disclosure provide an enhanced organic light-emitting display device and a method of manufacturing the same, which can suppress a rapid corrosion progress of a metal wiring of a flexible circuit board.

Additional aspects will be set forth in part in the description which follows and, in part, will be apparent from the description, or may be learned by practice of the presented exemplary embodiments.

According to an exemplary embodiment of the present disclosure, an organic light-emitting display device includes: a panel including a display unit on which an image is formed and a pad unit including a plurality of terminals connected to the display unit and arranged in a plurality of rows on a substrate; and a flexible circuit board including metal wirings arranged in a plurality of layers so as to be respectively connected in correspondence to the plurality of rows of terminals in the pad unit and being coupled to the pad unit, in which the pad unit includes a one-row terminal zone in which only terminals in a single row from among the plurality of rows of terminals electrically connect the metal wirings to the display unit.

The pad unit may include a high voltage region to which a relatively high voltage is applied and a low voltage region to which a relatively low voltage is applied, and the high voltage region may include the one-row terminal zone.

The plurality of rows of terminals may include inner first row terminals located close to the display unit and outer second row terminals located far from the display unit.

The second row terminals may be removed in the high voltage region.

The second row terminals may be separated from each other in the high voltage region and may not be electrically connected to the display unit.

The plurality of layers of metal wirings may include a first metal wiring connected to the first row terminals and a second metal wiring connected to the second row terminals.

The second metal wiring may be on a lower layer of the flexible circuit board adjacent to the pad unit, and the first metal wiring may be on an upper layer of the flexible circuit board spaced apart from the pad unit.

The panel may further include a pressure-sensitive adhesive layer on the substrate, and an anisotropic conductive layer may further be provided between the pad unit and the flexible circuit board.

One end of the pressure-sensitive adhesive layer and one end of the anisotropic conductive layer may be in contact with each other.

The organic light-emitting display device may further include a protective resin film configured to cover a gap between the panel and the flexible circuit board to prevent moisture penetration.

The display unit may include a thin-film transistor having an active layer, a gate electrode, a source electrode, and a drain electrode formed on the substrate, and an organic light-emitting device connected to the thin-film transistor, and the plurality of rows of terminals may be formed of a same material and in a same layer as the source electrode and the drain electrode.

The panel may further include a gate wiring connected to the plurality of rows of terminals and formed of a same material and in a same layer as the gate electrode.

According to an exemplary embodiment of the present disclosure, a method of manufacturing an organic light-emitting display device includes: forming a display unit on which an image is formed and a pad unit including a plurality of terminals connected to the display unit and arranged in a plurality of rows on a substrate of a panel; and coupling a flexible circuit board including a plurality of layers of metal wirings corresponding to a plurality of rows of terminals in the pad unit to the pad unit and connecting the plurality of rows of terminals to the plurality of layers of metal wirings; in which the coupling of the flexible circuit board to the pad unit includes: forming a one-row terminal zone wherein only terminals in a single row from among the plurality of rows of terminals in the pad unit are electrically connected to the display unit; and connecting a metal wiring in a layer corresponding to the single row from among the plurality of layers of metal wirings provided on the flexible circuit board to the one-row terminal zone.

The pad unit may include a high voltage region to which a relatively high voltage is applied and a low voltage region to which a relatively low voltage is applied, and the high voltage region may include the one-row terminal zone.

The plurality of rows of terminals may include inner first row terminals located close to the display unit and outer second row terminals located far from the display unit.

The second row terminals may be removed in the high voltage region.

The second row terminals may be separated from each other in the high voltage region and may not be electrically connected to the display unit.

The plurality of layers of metal wirings may include a first metal wiring connected to the first row terminals and a second metal wiring connected to the second row terminals.

The second metal wiring may be on a lower layer of the flexible circuit board adjacent to the pad unit, and the first metal wiring may be on an upper layer of the flexible circuit board spaced apart from the pad unit.

The method of manufacturing an organic light-emitting display device may further include: forming a pressure-sensitive adhesive layer on the substrate; and forming an anisotropic conductive layer between the pad unit and the flexible circuit board.

One end of the pressure-sensitive adhesive layer and one end of the anisotropic conductive layer may be in contact with each other when the pad unit and the flexible circuit board are coupled to each other.

The method of manufacturing an organic light-emitting display device may further include forming a protective resin film configured to cover a gap between the panel and the flexible circuit board to prevent moisture penetration.

The display unit may include a thin-film transistor having an active layer, a gate electrode, a source electrode, and a drain electrode formed on the substrate, and an organic light-emitting device connected to the thin-film transistor, and the plurality of rows of terminals may be formed of a same material and in a same layer as the source electrode and the drain electrode.

A gate wiring connected to the plurality of rows of terminals in the panel may be formed of a same material and in a same layer as the gate electrode.

According to an exemplary embodiment of the present disclosure, an organic light-emitting display device includes: a panel including a display unit and a pad unit, the pad unit including a plurality of rows of terminals connected to the display unit on a substrate; and a flexible circuit board including a plurality of layers of metal wirings each respectively connected to corresponding one of the plurality of rows of terminals in the pad unit, in which the pad unit includes a high voltage region to which a relatively high voltage is applied and a low voltage region to which a relatively low voltage is applied, the plurality of rows of terminals include inner first row terminals located close to the display unit and outer second row terminals located far from the display unit, and the second row terminals in the high voltage region are removed or not electrically connected to the display unit.

The plurality of layers of metal wirings may include a first metal wiring connected to the first row terminals and a second metal wiring connected to the second row terminals, and the second metal wiring may be on a lower layer of the flexible circuit board adjacent to the pad unit and the first metal wiring may be on an upper layer of the flexible circuit board spaced apart from the pad unit.

BRIEF DESCRIPTION OF THE DRAWINGS

These and/or other aspects will become apparent and more readily appreciated from the following description of the exemplary embodiments, taken in conjunction with the accompanying drawings in which:

FIG. 3 is a cross-sectional view taken along line III-III of FIG. 1;

Figure 1:
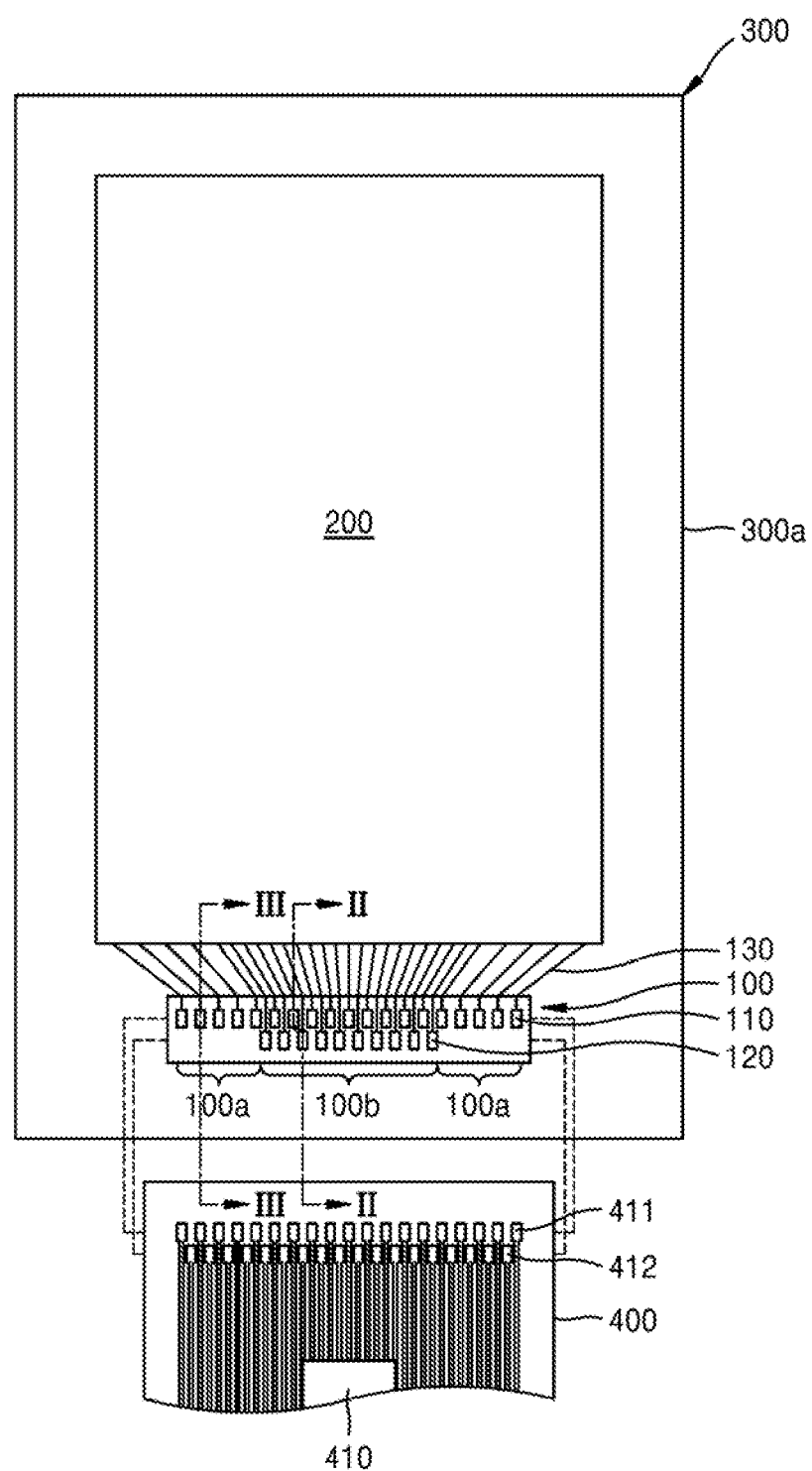
FIG. 1 is a plan view of an organic light-emitting display device according to an exemplary embodiment of the present disclosure.

Since the drawings in FIGS. 1-6 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

As the present disclosure allows for various changes and numerous embodiments, exemplary embodiments of the present disclosure will be illustrated in the drawings and described in detail in the written description. An effect and a characteristic of the present disclosure and a method of accomplishing these will be apparent when referring to the exemplary embodiments described with reference to the drawings. The present disclosure may, however, be embodied in many different forms and should not be construed as limited to the specific exemplary embodiments set forth herein.

Reference will now be made in detail to the exemplary embodiments of the present disclosure, examples of which are illustrated in the accompanying drawings, wherein like reference numerals refer to like elements throughout, and repeated description thereof will be omitted.

An expression used in the singular encompasses the expression of the plural, unless it has a clearly different meaning in the context.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

When a certain exemplary embodiment is implemented differently, a specific process order may be performed differently from the described order. For example, two consecutively described processes may be performed substantially at the same time or performed in an order opposite to the described order.

FIG. 1 is a plan view of an organic light-emitting display device according to an exemplary embodiment of the present disclosure. A flexible circuit board 400 is coupled to a pad unit 100 on a panel 300, but both sides of the organic light-emitting display device are shown as being separated for convenience of explanation.

As shown in FIG. 1, the panel 300 of the organic light-emitting display device includes a display unit 200 having an organic light-emitting device EL and a thin-film transistor TFT, and a pad unit 100 provided with a plurality of terminals 110 and 120 electrically connected to the display unit 200.

The terminals 110 and 120 are arranged in two rows with inner first row terminals 110 located near the display unit 200 and outer second row terminals 120 located far from the display unit 200 in the pad unit 100. The center portion of the pad unit 110 corresponds to a low voltage region 100b in which a relatively low voltage is applied, and both edge portions of the pad unit 110 correspond to a high voltage region 100a in which a relatively high voltage is applied. As shown in FIG. 1, the first row terminals 110 and the second row terminals 120 are arranged in two rows in the low voltage region 100b as described above. However, the high voltage region 100a includes a 'one-row terminal zone' in which only the first row terminals 110 are arranged in a single row (Hereinafter, the high voltage region 100a is also referred to as a one-row terminal zone 100a). This is a measure for blocking the formation of an environment where corrosion may proceed because the high voltage region 100a is more susceptible to corrosion. The detailed principle will be described again later below.

The flexible circuit board 400 includes a first metal wiring 411 connected to the first row terminals 110, and a second metal wiring 412 connected to the second row terminals 120. Accordingly, when the flexible circuit board 400 is coupled to the pad unit 100, the first metal wiring 411 is in contact with and electrically connected to the first row terminals 110, and the second metal wiring 412 is in contact with and electrically connected to the second row terminals 120. The second metal wiring 412 is located at a level lower than that of the first metal wiring 110 in the flexible circuit board 400. Since there is no second row terminals 120 in the one-row terminal zone 100a, only the connection between the first row terminals 110 and the first metal wiring 411 is performed and the second metal wiring 412 is in a floating state that is not electrically connected to the pad unit 100. Reference numeral 410 denotes a driving chip, which is an external device, provided on the flexible circuit board 400. By coupling the flexible circuit board 400 to the pad unit 100, the driving chip 410 is electrically connected to the thin-film transistor TFT and the organic light-emitting device EL in the display unit 200.

Figure 2:
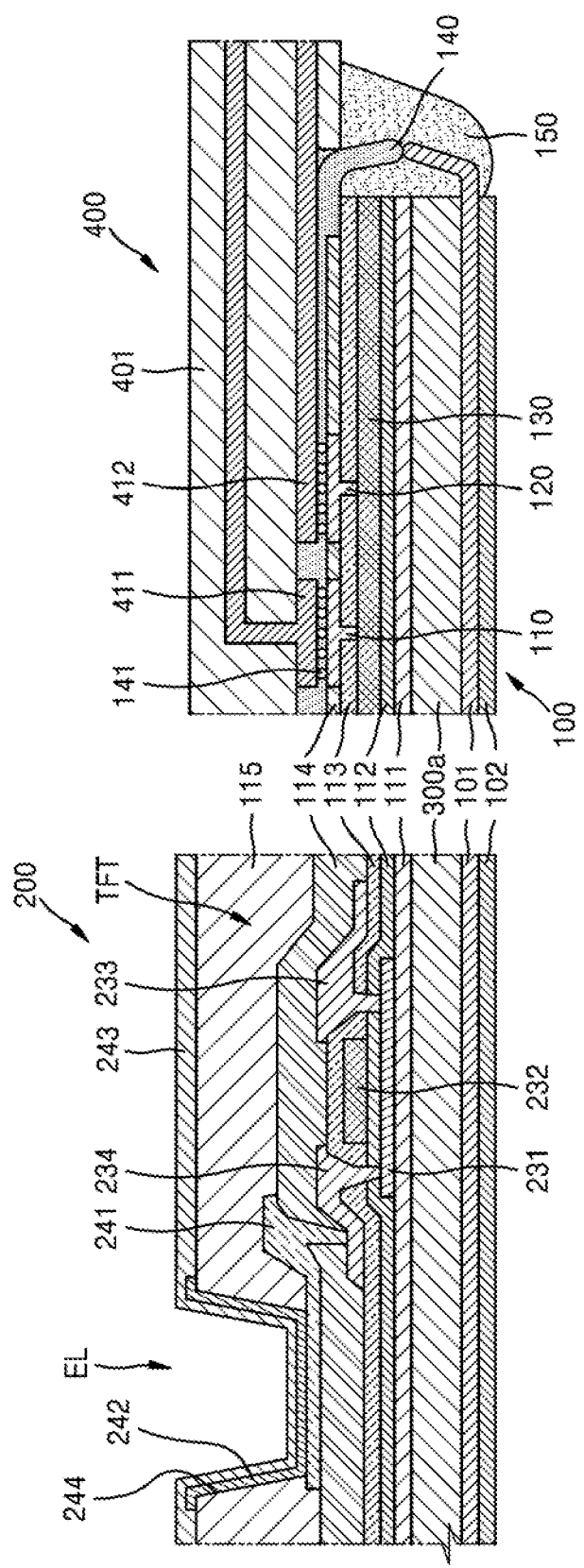
FIG. 2 is a cross-sectional view taken along line II-II of FIG. 1.

Referring to FIGS. 2 and 3, a pixel cross-sectional structure of the display unit 200 and a cross-sectional structure in which the pad unit 100 and the flexible circuit board 400 are connected to each other will be described.

FIG. 2 is a cross-sectional view taken along line II-II of FIG. 1, that is, the cross-sectional view is taken in the low voltage region 100b, and FIG. 3 is a cross-sectional view taken along line III-III of FIG. 1, that is, the cross-sectional view is taken in the one-row terminal zone 100a which is a high voltage region 100a.

First, a pixel structure of the display unit 200 and the low voltage region 100b of the pad unit 100 of FIG. 2 will be described. The left side of FIG. 2 shows a structure of one pixel in the display unit 200, and the right side shows the low voltage region 100b of the pad unit 100 and the flexible circuit board 400.

The pixel of the display unit 200 includes the thin-film transistor TFT and the organic light-emitting device EL. The thin-film transistor TFT includes a pressure-sensitive adhesive layer 101 stacked on a substrate 300a, and an active layer 231 formed of an amorphous silicon thin film or a polycrystalline silicon thin film on a buffer layer 111 which is also stacked on the substrate 300a. The buffer layer 111 serves to prevent permeation of undesirable elements. The pressure sensitive adhesive layer 101 and the buffer layer 111 may be formed on opposite sides of the substrate 300a. The active layer 231 includes source and drain regions doped with a high concentration of N-type or P-type impurities. For reference, the active layer 231 may be formed of an oxide semiconductor. For example, the oxide semiconductor may include an oxide of a material selected from metal elements of groups 12, 13, and 14, such as, for example, zinc (Zn), indium (In), gallium (Ga), tin (Sn), cadmium (Cd), germanium (Ge), and hafnium (Hf), and a combination thereof. For example, the active layer 231 may include indium-gallium-zinc oxide (IGZO), $[(In_2O_3)_a(Ga_2O_3)_b(ZnO)_c]$ (a, b and c are real numbers satisfying conditions of a≥0, b≥0, c≥0, respectively).

A gate electrode 232 is formed on the active layer 231 with a first insulating layer 112 interposed therebetween. A source electrode 233 for supplying a reference voltage for driving the active layer 231 and a drain electrode 234 for connecting the thin-film transistor TFT and the organic light-emitting device EL to apply a driving power to the organic light-emitting device EL are formed on the gate electrode 232. That is, the thin-film transistor TFT has the active layer 231, the gate electrode 232, the source electrode 233, and the drain electrode 234 formed on the substrate 300a, and is connected to the organic light-emitting device EL. A second insulating layer 113 is formed between the gate electrode 232 and the source and drain electrodes 233 and 234, and a passivation layer 114 is formed between the source and drain electrodes 233 and 234 and a first electrode 241, which is an anode electrode of the organic light-emitting device EL.

An insulating planarization layer 115 including acrylic polymer or the like is formed on the first electrode 241, and a predetermined opening 244 is formed in the insulating planarization layer 115, then elements of the organic light-emitting device EL are formed in the opening 244.

The organic light-emitting device EL emits red, green, and blue lights according to a current flow to display images based on predetermined image information. The organic light-emitting device EL includes the first electrode 241 that is an anode electrode connected to the drain electrode 234 of the thin-film transistor TFT and supplied with a positive power from the drain electrode 234, a second electrode 243 that is a cathode electrode covering all pixels and supplying a negative power, and an emission layer 242 sandwiched between the first and second electrodes 241 and 243 and emitting light when electricity is applied.

The first electrode 241 as an anode electrode may be a transparent electrode formed of such as an indium tin oxide (ITO) and the second electrode 243 may be formed by front deposition using aluminum (Al)/calcium (Ca) (aluminum (Al) layer over calcium (Ca) layer) or the like, when the display unit 200 is a back emission type in which light is emitted toward the substrate 300a. When the display unit 200 is a front emission type in which the display unit 200 emits light in a direction opposite to the substrate 300a, the second electrode 243 may be formed of a transparent material by forming a thin semi-transparent thin film with a metal such as magnesium (Mg):silver (Ag) (alloy of magnesium (Mg) and silver (Ag)) and then depositing a transparent ITO thereon. The first electrode 241 and the second electrode 243 may be stacked in opposite positions with the emission layer 242 interposed therebetween, and the second electrode 243 may be formed in various patterns without necessarily being front-deposited.

The emission layer 242 may be a low-molecular weight organic layer or a high-molecular weight organic layer. The high-molecular weight organic layer may include an organic polymer. A hole injection layer (HIL), a hole transport layer (HTL), an electron transport layer (ETL), and an electron injection layer (EIL) may be stacked adjacent to the emission layer 242. For example, at least one of the hole injection layer (HIL) and the hole transport layer (HTL) may be disposed between the first electrode 241 and the emission layer 242, and at least one of the electron transport layer (ETL) and the electron injection layer (EIL) may be disposed between the emission layer 242 and the second electrode 243.

For reference, the emission layer 242 may be formed separately for each pixel so that pixels emitting red, green, and blue lights are gathered to form one unit pixel. Alternatively, the emission layer 242 may be formed in common over the entire pixel area regardless of locations of pixels. Here, the emission layer 242 may be formed by vertically stacking or mixing layers including luminescent materials that emits, e.g., red, green, and blue lights. Also, light may have other color combinations, which emit a white color of light. For example, the emission layer 242 may have a multi-layered structure in which a red emission layer, a green emission layer, and a blue emission layer are stacked to emit white light or may have a single layer structure including a red light-emitting material, a green light-emitting material, and a blue light-emitting material together to emit white light. Furthermore, a color-conversion layer or a color filter that converts the white light, that is emitted, into a prescribed color of light. In addition, a plurality of thin-film transistors TFT may be provided corresponding to one organic light-emitting device EL. Also, one or more capacitors may be provided in addition to the plurality of thin-film transistors TFT.

The pad unit 100 has a stack structure similar to that of the display unit 200. That is, the buffer layer 111 and the first insulating layer 112 are sequentially stacked on the substrate 300a and are formed together, and each is formed in a layer the same as a corresponding layer in the display unit 200. A pressure-sensitive adhesive layer 101 is applied to a back surface of the substrate 300a, and a protective film 102 is attached thereto.

A gate wiring 130 connecting the pad unit 100 and the display unit 200 is formed on the first insulating layer 112. The gate wiring 130 is formed of a same material and in a same layer as the gate electrode 232 of the display unit 200.

The second insulating layer 113 is formed on the gate wiring 130, and the first and second row terminals 110 and 120 connected to the gate wiring 130 are formed on the second insulating layer 113. The first and second row terminals 110 and 120 are formed of a same material and in a same layer as the source electrode 233 and the drain electrode 234 of the display unit 200. The passivation layer 114 surrounds the first and second row terminals 110 and 120, and upper surfaces of the first and second row terminals 110 and 120 are exposed so that the flexible circuit board 400 may be connected thereto.

The flexible circuit board 400 includes the first metal wiring 411 connected to the first row terminals 110 and the second metal wiring 412 connected to the second row terminals 120 as a double layer, and an anisotropic conductive film 140, i.e., an anisotropic conductive layer, including a conductive ball 141 is interposed between the flexible circuit board 400 and the pad unit 100. The second metal wiring 412 is on a lower layer of the flexible circuit board 400 adjacent to the pad unit 100 and the first metal wiring 411 is on an upper layer of the flexible circuit board 400 spaced apart from the pad unit 100.

Reference numeral 150 denotes a moisture-proofing protective resin film which prevents moisture from penetrating into a gap between the panel 300 and the flexible circuit board 400. That is, generally, since the flexible circuit board 400 is attached to the panel 300 and then bent, moisture may penetrate through the gap, thus the protective resin film 150 is applied to protect the flexible circuit board 400.

As shown in FIGS. 2 and 3, ends of the anisotropic conductive film 140 and the pressure-sensitive adhesive layer 101 frequently come out of the flexible circuit board 400 and the pad unit 100, and are brought into contact with each other in a process of pressing the flexible circuit board 400 onto the pad unit 100. That is, when the flexible circuit board 400 is attached to the pad unit 100 by applying pressure, the ends of the anisotropic conductive film 140 and the pressure-sensitive adhesive layer 101 that are soft are pushed outward, and the ends often come into contact with each other in the protective resin film 150. In this case, a corrosive material such as halogen impurity included in the pressure-sensitive adhesive layer 101 acts as a catalyst, thereby accelerating corrosion of the second metal wiring 412, which is particularly close to the contact portion. The halogen component of the halogen impurity may react with a metal to form a metal halide. The halogen impurity may also exist as halides, and halides have ionic conductivity and may migrate under electric field. Thus, it is presumed that the corrosive material such as the halogen impurity in pressure-sensitive adhesive layer 101 at the end of panel 300 contacts the adjacent second metal wiring 412 through unintended contact of the end of the pressure-sensitive adhesive layer 101 to promote corrosion in the high voltage environment. Accordingly, such a corrosion promotion phenomenon occurs in proportion to the magnitude of a voltage applied to the pad unit 100 and the flexible circuit board 400. Since a voltage applied to the low voltage region 100b shown in FIG. 2 is low, there is almost no possibility of the corrosion promotion phenomenon. Therefore, even if the ends of the anisotropic conductive film 140 and the pressure-sensitive adhesive layer 101 come out and are brought into contact with each other, corrosion does not occur.

When the ends of the anisotropic conductive film 140 and the pressure-sensitive adhesive layer 101 come into contact with each other in the high voltage region 100a where a relatively high voltage is applied, corrosion may be promoted. Therefore, a structure enhancement measure for inhibiting corrosion promotion as shown in FIG. 3 is made. That is, the second metal wiring 412 is brought into a floating state not connected to the pad unit 100.

A structure of the high voltage region 100a of FIG. 3 is basically the same as that of the low voltage region 100b of FIG. 2. However, as shown in FIG. 1, there are no second row terminals 120 and only the first row terminals 110 are arranged. That is, the one-column terminal zone 100a is made. Accordingly, as shown in FIG. 3, only the first metal wiring 411 of the flexible circuit board 400 is connected to the first row terminals 110 and the second metal wiring 412 is in a floating state not connected to terminals of the pad unit 100.

Even if the corrosive material of the pressure-sensitive adhesive layer 101 is likely to promote corrosion of the second metal wiring 412 adjacent to the contact portion of the pressure-sensitive adhesive layer 101 with the anisotropic conductive film 140, corrosion is not promoted because the second metal wiring 412 is in a floating state in which no voltage is applied. That is, the high voltage region 100a is set as the one-row terminal zone 100a so that a high voltage is applied through the first row terminals 110 and the first metal wiring 411 which are spaced by a proper distance from the contact portion between the pressure-sensitive adhesive layer 101 and the anisotropic conductive film 140, and the second metal wiring 412 is connected only to the low voltage region 100b of the pad unit 100 to prevent a corrosion promotion phenomenon of the second metal wiring 412 in the high voltage region 100a. Accordingly, the organic light-emitting display device according to the present embodiment may effectively suppress a corrosion progress on a metal wiring, such as the second metal wiring 412 of a flexible circuit board, thereby providing more reliable product.

Taking an example of the use of these wires in actual driving, when red, green, and blue signals are sent to the display unit 200 of the panel 300, the first metal wiring 411 may be used to apply the green signal and the second metal wiring 412 may be used to apply the red and blue cross signals. The low voltage region 100b at the center of the pad unit 100 is used as a data wiring to receive all of the red, green and blue signals to connect the first and second row terminals 110 and 120 together, and the high voltage region 100a on both edges of the pad unit 100 may be used for driving signals so that there is no problem in exchange of signals even if there is only the one-row terminal zone 100a.

As shown in FIGS. 2 and 3 and described above, it is possible to provide a better arrangement structure of the terminals 110 and 120 in the pad unit 100, thereby solving the problem of promoting corrosion of the second metal wiring 412. Therefore, a more reliable product may be provided.

Figure 4A:
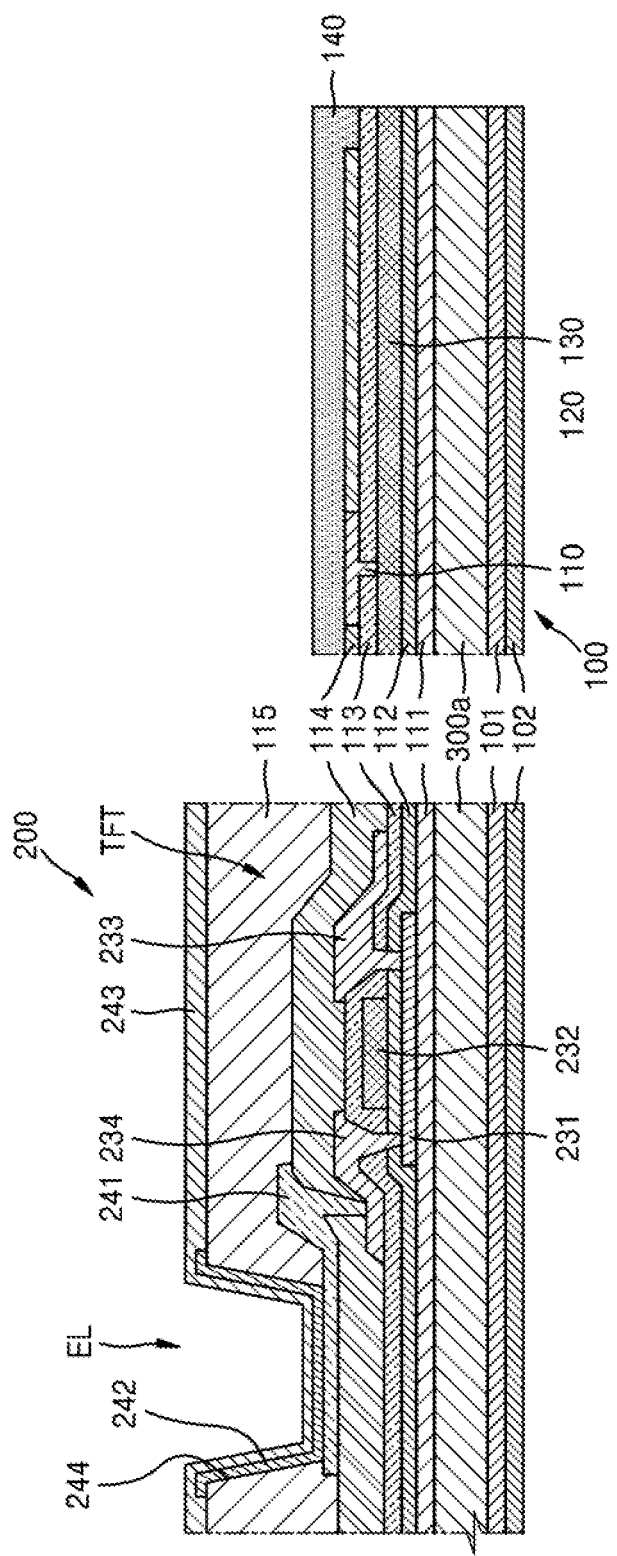
FIGS. 4A to 4C are cross-sectional views sequentially illustrating a coupling process of a pad unit and a flexible circuit board in the organic light-emitting display of FIG. 1.
Figure 4B:
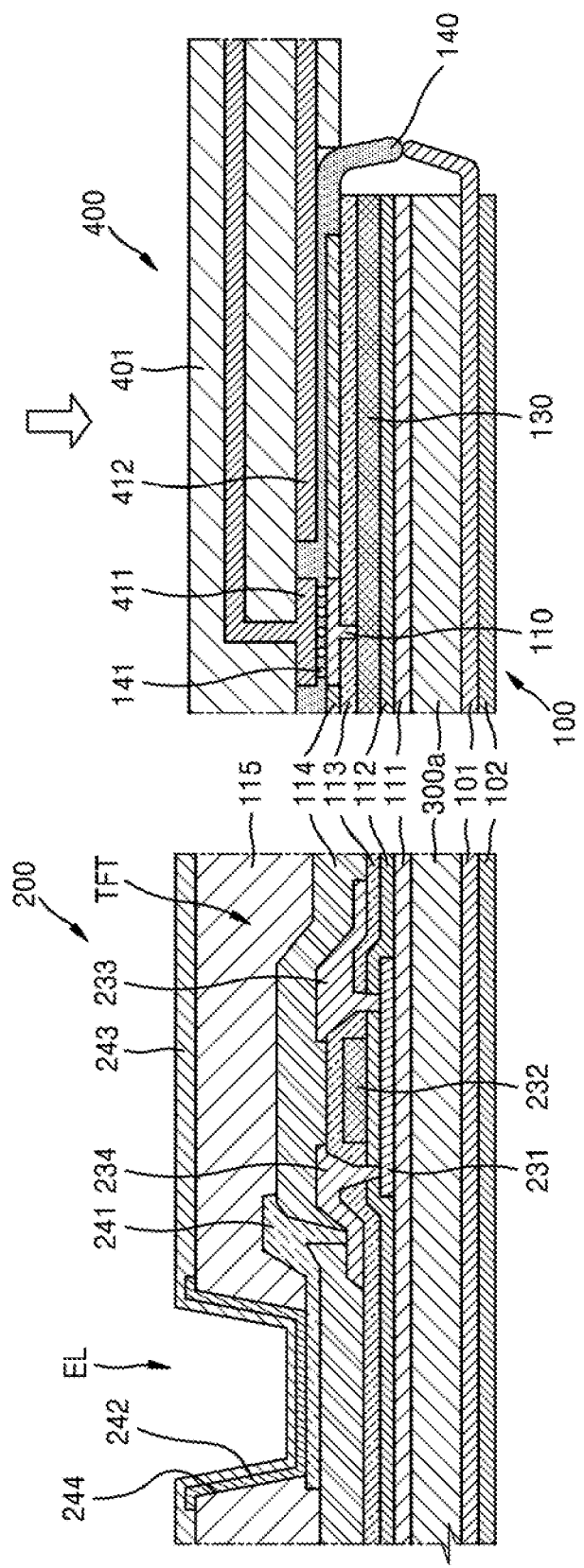
Figure 4C:
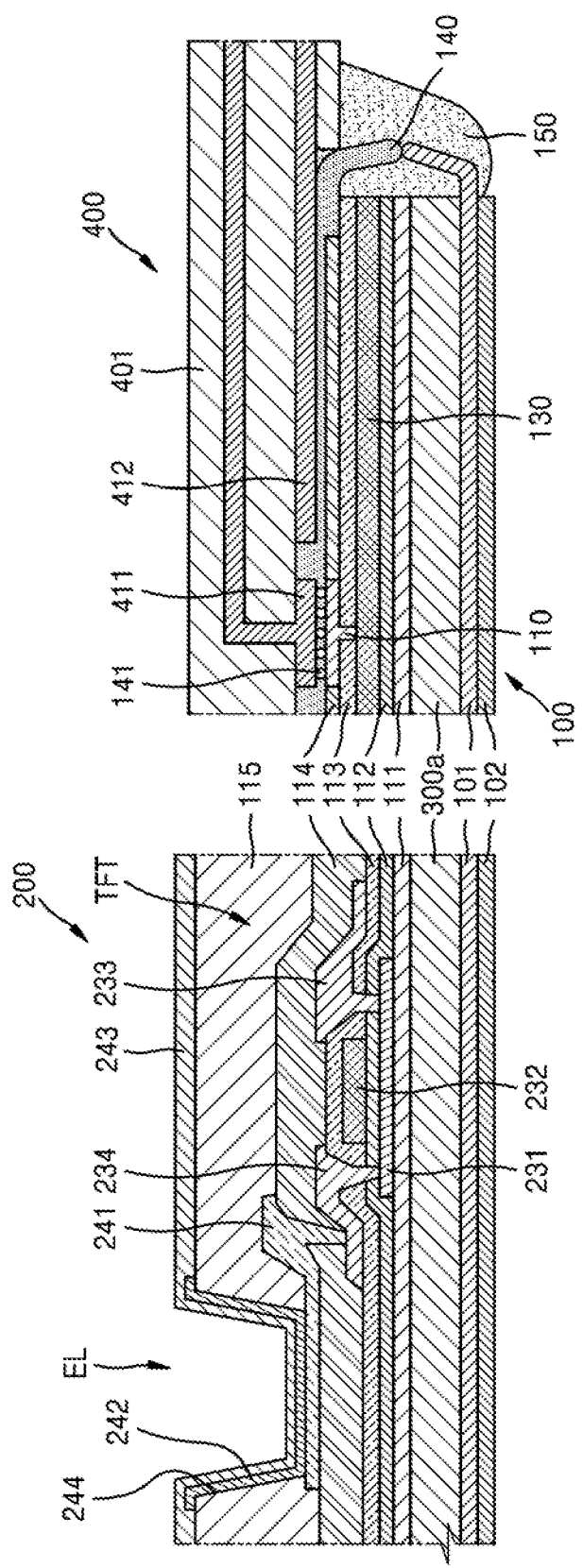

The organic light-emitting display device as described above may be manufactured as shown in FIGS. 4A to 4C. FIGS. 4A to 4C are cross-sectional views of the organic light-emitting display device at the one-row terminal zone 100a similar to FIG. 3 at different steps in the process of coupling the flexible circuit board 400 to the pad unit 100.

First, as shown in FIG. 4A, layers of the display unit 200 and the pad unit 100 are stacked on the substrate 300a. The anisotropic conductive film 140 is applied on the pad unit 100 for coupling the flexible circuit board 400 to the pad unit 100. The pressure-sensitive adhesive layer 101 and the anisotropic conductive film 140 of the pad unit 100 are not yet pushed outward.

Thereafter, the flexible circuit board 400 is pushed toward and attached onto the pad unit 100 as shown in FIG. 4B, so that the first row terminals 110 and the first metal wiring 411 are connected to each other. Since the one-row terminal zone 100a which is a high-voltage region is shown here, the second metal wiring 412 becomes a floating state. However, the second metal wiring 412 is also connected to the second row terminals 120 in the low voltage region 100b as shown in FIG. 2. Here, the pressure-sensitive adhesive layer 101 and the anisotropic conductive film 140 are pushed outward and contact each other due to the pushing pressure. In the drawings, the pressure-sensitive adhesive layer 101 and the anisotropic conductive film 140 seem to be point contact, and the probability of contact with each other is low. However, in practice, since the pressure-sensitive adhesive layer 101 and the anisotropic conductive film 140 are pushed outward to a large extent at their ends and are connected to each other even if they touch only a portion, there is a much higher probability of being connected to each other.

Since a high voltage is not applied to the second metal wiring 412 even if the pressure-sensitive adhesive layer 101 and the anisotropic conductive film 140 are connected to each other, the corrosion of the adjacent second metal wiring 412 by the corrosive material of the pressure-sensitive adhesive layer 101 is not promoted.

Thereafter, as shown in FIG. 4C, a gap between the panel 300 and the flexible circuit board 400 is covered and protected by the protective resin film 150.

As shown in FIGS. 4A-4C and described above, even if the ends of the pressure-sensitive adhesive layer 101 and the anisotropic conductive film 140 are in contact with each other during the coupling process of the flexible circuit board 400 and the pad unit 100, the organic light-emitting display device according to the present embodiment floats the adjacent second metal wiring 412 to eliminate the corrosion promotion phenomenon of the adjacent second metal wiring 412 in the high voltage environment. Therefore, the stability and reliability of a product may be ensured.

Figure 5:
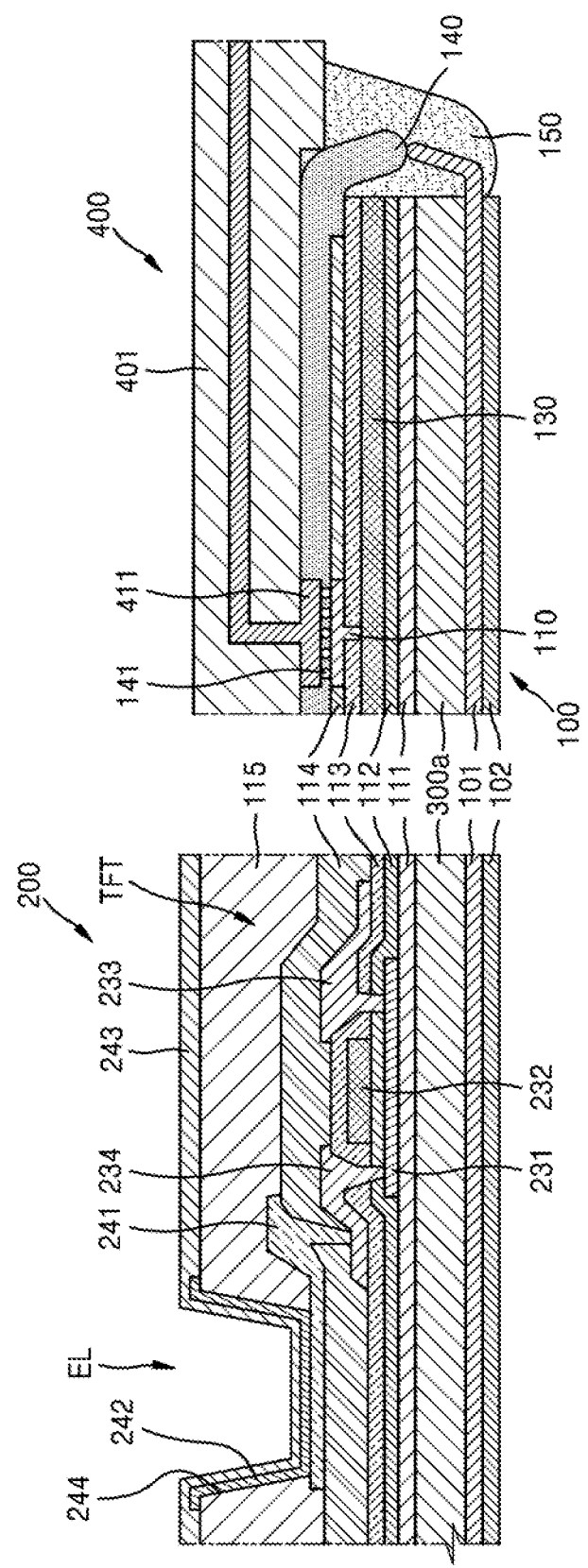
FIG. 5 is a cross-sectional view of an organic light-emitting display device according to an exemplary embodiment of the present disclosure.

In the above-described embodiment, the second row terminals 120 are removed only in the high voltage region 100a of the pad unit 100 to form the one-row terminal zone 100a. However, as shown in FIG. 5, according to an exemplary embodiment of the present disclosure, the second metal wiring 412 may also be removed from the flexible circuit board 400. That is, since only both ends of the first metal wiring 411 and the first row terminals 110 are connected to each other in the high voltage region 100a, the second metal wiring 412 may also be removed in the high voltage region 100a. A corrosion concern will be removed. Accordingly, a reliable product may be obtained.

Figure 6:
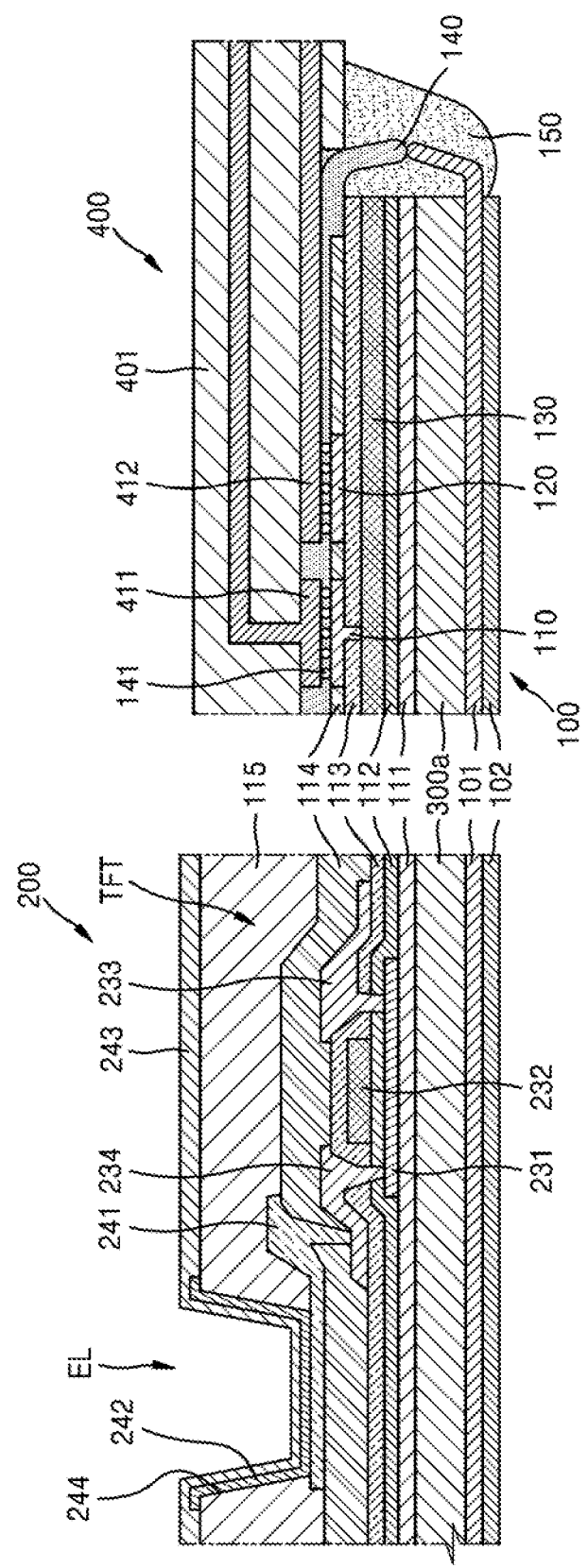
FIG. 6 is a cross-sectional view of an organic light-emitting display device according to an exemplary embodiment of the present disclosure.

A variation as shown in FIG. 6 is also possible. That is, according to an exemplary embodiment of the present disclosure, the second row terminals 120 are left in the high voltage region 100a of the pad unit 100 as in the low voltage region 100b. Instead, the second row terminals 120 are not connected to the gate wiring 130. For example, the second row terminals 120 are separated from each other in the high voltage region 100a and are not electrically connected to the display unit 200. If one of the first and second row terminals 110 and 120 in the high voltage region 100a and the low voltage region 100b is missing, a step is formed between the high voltage region 100a and the low voltage region 100b, so that there is a risk that peeling may occur due to uneven adhesion when the flexible circuit board 400 is compressed. Here, the first and second row terminals 110 and 120 are uniformly provided in both the high voltage region 100a and the low voltage region 100b, so that it may reduce the risk described above. In addition, according to the above description, the second row terminals 120 are brought into a floating state, so that the corrosion promotion phenomenon of the adjacent second metal wiring 412 due to the connection of the ends of the pressure-sensitive adhesive layer 101 and the anisotropic conductive film 140 in a high voltage environment may be suppressed in a manner the same as that described in the above embodiment.

According to the organic light-emitting display device and the method of manufacturing the same of the exemplary embodiments of the present disclosure described above, it may effectively suppress a rapid corrosion progress of a metal wiring of a flexible circuit board, thereby enhancing reliability of a product by preventing defective driving due to corrosion.

It should be understood that exemplary embodiments of the present disclosure described herein should be considered in a descriptive sense only and not for purposes of limitation. Descriptions of features or aspects within each exemplary embodiment should typically be considered as available for other similar features or aspects in other embodiments.

While specific exemplary embodiments have been described with reference to the figures, it will be understood by those of ordinary skill in the art that various changes in form and details may be made therein without departing from the spirit and scope as defined by the following claims.

What is claimed is:

1. An organic light-emitting display device comprising:
   a panel comprising a display unit on which an image is formed and a pad unit comprising a plurality of terminals connected to the display unit and arranged in a plurality of rows on a substrate; and
   a flexible circuit board comprising metal wirings arranged in a plurality of layers so as to be respectively connected in correspondence to the plurality of rows of terminals in the pad unit and being coupled to the pad unit,
   wherein the pad unit comprises a one-row terminal zone in which only terminals in a single row from among the plurality of rows of terminals electrically connect the metal wirings to the display unit.

2. The organic light-emitting display device of claim 1, wherein the pad unit comprises a high voltage region to which a relatively high voltage is applied and a low voltage region to which a relatively low voltage is applied, and
   the high voltage region comprises the one-row terminal zone.

3. The organic light-emitting display device of claim 2, wherein the plurality of rows of terminals comprise inner first row terminals located close to the display unit and outer second row terminals located far from the display unit.

4. The organic light-emitting display device of claim 3, wherein the second row terminals are removed in the high voltage region.

5. The organic light-emitting display device of claim 3, wherein the second row terminals are separated from each other in the high voltage region and are not electrically connected to the display unit.

6. The organic light-emitting display device of claim 3, wherein the plurality of layers of metal wirings comprise a first metal wiring connected to the first row terminals and a second metal wiring connected to the second row terminals.

7. The organic light-emitting display device of claim 6, wherein the second metal wiring is on a lower layer of the flexible circuit board adjacent to the pad unit and the first metal wiring is on an upper layer of the flexible circuit board spaced apart from the pad unit.

8. The organic light-emitting display device of claim 1, wherein the panel further comprises a pressure-sensitive adhesive layer on the substrate, and
   an anisotropic conductive layer is further provided between the pad unit and the flexible circuit board.

9. The organic light-emitting display device of claim 8, wherein one end of the pressure-sensitive adhesive layer and one end of the anisotropic conductive layer are in contact with each other.

10. The organic light-emitting display device of claim 9, further comprising:
    a protective resin film configured to cover a gap between the panel and the flexible circuit board to prevent moisture penetration.

11. The organic light-emitting display device of claim 1, wherein the display unit comprises a thin-film transistor having an active layer, a gate electrode, a source electrode, and a drain electrode formed on the substrate, and an organic light-emitting device connected to the thin-film transistor, and
    the plurality of rows of terminals are formed of a same material and in a same layer as the source electrode and the drain electrode.

12. The organic light-emitting display device of claim 11, wherein the panel further comprises a gate wiring connected to the plurality of rows of terminals and formed of a same material and in a same layer as the gate electrode.

13. A method of manufacturing an organic light-emitting display device, the method comprising:
    forming a display unit on which an image is formed and a pad unit comprising a plurality of terminals connected to the display unit and arranged in a plurality of rows on a substrate of a panel; and
    coupling a flexible circuit board comprising a plurality of layers of metal wirings corresponding to a plurality of rows of terminals in the pad unit to the pad unit, and connecting the plurality of rows of terminals to the plurality of layers of metal wirings,
    wherein the coupling of the flexible circuit board to the pad unit comprises:
        forming a one-row terminal zone, wherein only terminals in a single row from among the plurality of rows of terminals in the pad unit are electrically connected to the display unit; and
        connecting a metal wiring in a layer corresponding to the single row from among the plurality of layers of metal wirings provided on the flexible circuit board to the one-row terminal zone.

14. The method of claim 13, wherein the pad unit comprises a high voltage region to which a relatively high voltage is applied and a low voltage region to which a relatively low voltage is applied, and
    the high voltage region comprises the one-row terminal zone.

15. The method of claim 14, wherein the plurality of rows of terminals comprise inner first row terminals located close to the display unit and outer second row terminals located far from the display unit.

16. The method of claim 15, wherein the second row terminals are removed in the high voltage region.

17. The method of claim 15, wherein the second row terminals are separated from each other in the high voltage region and are not electrically connected to the display unit.

18. The method of claim 15, wherein the plurality of layers of metal wirings comprise a first metal wiring connected to the first row terminals and a second metal wiring connected to the second row terminals.

19. The method of claim 18, wherein the second metal wiring is on a lower layer of the flexible circuit board adjacent to the pad unit and the first metal wiring is on an upper layer of the flexible circuit board spaced apart from the pad unit.

20. The method of claim 13, further comprising:
    forming a pressure-sensitive adhesive layer on the substrate; and
    forming an anisotropic conductive layer between the pad unit and the flexible circuit board.

21. The method of claim 20, wherein one end of the pressure-sensitive adhesive layer and one end of the anisotropic conductive layer are in contact with each other when the pad unit and the flexible circuit board are coupled to each other.

22. The method of claim 21, further comprising:
forming a protective resin film configured to cover a gap between the panel and the flexible circuit board to prevent moisture penetration.

23. The method of claim 13, wherein the display unit comprises a thin-film transistor having an active layer, a gate electrode, a source electrode, and a drain electrode formed on the substrate, and an organic light-emitting device connected to the thin-film transistor, and
the plurality of rows of terminals are formed of a same material and in a same layer as the source electrode and the drain electrode.

24. The method of claim 23, wherein a gate wiring connected to the plurality of rows of terminals in the panel is formed of a same material and in a same layer as the gate electrode.

25. An organic light-emitting display device comprising:
a panel comprising a display unit and a pad unit, the pad unit comprising a plurality of rows of terminals connected to the display unit on a substrate; and
a flexible circuit board comprising a plurality of layers of metal wirings each respectively connected to corresponding one of the plurality of rows of terminals in the pad unit,
wherein the pad unit comprises a high voltage region to which a relatively high voltage is applied and a low voltage region to which a relatively low voltage is applied,
the plurality of rows of terminals comprise inner first row terminals located close to the display unit and outer second row terminals located far from the display unit, and
the second row terminals in the high voltage region are removed or not electrically connected to the display unit.

26. The organic light-emitting display device of claim 25, wherein the plurality of layers of metal wirings comprise a first metal wiring connected to the first row terminals and a second metal wiring connected to the second row terminals, and
the second metal wiring is on a lower layer of the flexible circuit board adjacent to the pad unit and the first metal wiring is on an upper layer of the flexible circuit board spaced apart from the pad unit.

* * * * *